United States Patent [19]
Weber

[11] Patent Number: 5,909,143
[45] Date of Patent: Jun. 1, 1999

[54] CIRCUIT FOR DETERMINING AND STORING AN AVERAGE SIGNAL VALUE

[75] Inventor: Stephan Weber, Munich, Germany

[73] Assignee: Siemens Aktiengesellschaft, Munich, Germany

[21] Appl. No.: 08/912,831

[22] Filed: Aug. 19, 1997

[30] Foreign Application Priority Data

Sep. 12, 1996 [DE] Germany ............... 19637151

[51] Int. Cl.$^6$ ............ H04L 25/06; H04L 25/10
[52] U.S. Cl. ................ 327/551; 327/72
[58] Field of Search .......... 327/551, 552, 327/553, 554, 555, 557, 558, 561, 563, 72, 77–80, 89–90, 91, 94, 96, 337; 330/149; 375/76

[56] References Cited

U.S. PATENT DOCUMENTS

| | | | |
|---|---|---|---|
| 4,112,372 | 9/1978 | Holmes et al. ............ | 325/321 |
| 4,250,453 | 2/1981 | Nilsson ............ | 327/557 |
| 4,739,189 | 4/1988 | Kellogg ............ | 327/555 |
| 5,392,317 | 2/1995 | Cho et al. ............ | 327/558 |
| 5,397,945 | 3/1995 | Shum et al. ............ | 327/557 |

OTHER PUBLICATIONS

Textbook Reference, Tietze/Schenk Electronic Circuits, 9, Edition, 1990 pp. 391–396.

*Primary Examiner*—My-Trang Nu Ton
*Attorney, Agent, or Firm*—Hill & Simpson

[57] ABSTRACT

In a circuit for determining and storing an average signal value, an overlaid dc voltage part is identified and subtracted from the actual signal. To this end, an all-pass filter with which both a transfer response is optimized and the error is minimized is utilized in a signal processing means in addition to a low-pass filter.

10 Claims, 2 Drawing Sheets

CIRCUIT FOR DETERMINING AND STORING AN AVERAGE SIGNAL VALUE

BACKGROUND OF THE INVENTION

1. Field of the Invention

The present invention is directed to a circuit for evaluating an input signal that is overlaid with a dc voltage part and, thereafter, for determining a data signal. The circuit includes (a) a signal input; (b) a signal processing means, including a filter, which forwards a part of the signal input; and (c) an evaluation means which compares the original signal from the signal input to the part of the signal forwarded from the signal processing means and determines a data signal.

2. Description of the Prior Art

Due to offset voltages, tolerances, etc., dc voltages are often superimposed on a signal. However, in order to optimally utilize the working range of the elements of a signal chain, it is also necessary to compensate for these dc voltages. Such compensation may be effected, for example, by determining the dc voltage of the signal part and then subtracting accordingly.

DC voltage parts are usually determined by a low-pass filtering process. An example which shows the necessity of such a low-pass filtering circuit is the synchronization in a TDMA system (Time Division Multiple Access). A TDMA system affords multiple access in a time-division multiplex method. Pursuant to such method, a transmitter transmits an alternating signal in what is referred to as a preamble. Due to the non-ideal properties in the transmission chain, additional dc voltage parts appear at the receiver output that must be compensated for in order to obtain optimum transmission quality. Since dc voltage parts or, more particularly, low-frequency parts are conceivable in normal data transmission, the dc voltage part within the preamble must be determined and then stored.

In a known circuit, the dc voltage part is determined by a low-pass filtering process. A compromise between speed and precision is made in view of the filter limit frequency and the time constant which is inversely proportional thereto. What is particularly problematical, however, is the determination of a switch point at which a switch is made from filtering to storing, since the system is not synchronized. A switch to storing can be made either as soon as possible and at the expense of precision or after waiting for the transition from preamble to the normal data. Given the employment of conventional linear filters, the latter also can ensue only with limited precision since the switchover can be recognized only when clearly tardy. In this case, the averaging of data becomes all the faultier the later recognition is made of the end of the preamble and the later that switching to storing occurs.

In a known approach to a solution, the delay is solved by using simple RC elements to average a delayed signal and not the current signal. The transfer response of such RC filters always has a monotonous character, i.e., the signal systematically runs away in one direction after the end of the preamble and a considerable hold error is caused accordingly. This error becomes smaller using filters of a higher order, but it does not completely disappear.

SUMMARY OF THE INVENTION

The present invention is based on the object of creating a processing circuit with which an average signal value can be determined and stored in an especially precise and dependable way. This object is achieved in a circuit having signal processing means which includes an all-pass filter and a low-pass filter wherein the low-pass filter and the all-pass filter are matched to one another such that a transfer response at a specific point in time is zero. Expressed differently, this means that the transfer response can be optimized by adding an all-pass filter wherein the hold error becomes zero given a known shut-off point.

The all-pass filter transmits all frequencies and effects a phase shift. The low-pass filter and the other elements of the signal processing means are referred to as minimal phase systems wherein amplitude response and phase response are firmly coupled to one another. A stable system in the sense of system theory therefore derives as a result of the series connection of the all-pass filter and the minimal phase system.

It is fundamentally possible to construct the circuit such that the filter of the signal processing means is a high-pass filter. However, employment of a low-pass filter in the signal processing means is preferred so that the signal determined by the signal processing means can be subtracted from the input signal in the evaluation means. The signal processing means also preferably includes a track and hold circuit in which the identified dc voltage part can be stored. The track and hold circuit is comparable to a standard sample and hold circuit and is intended to store the identified dc voltage part. In addition, the all-pass filter is connected in series with the other elements within the signal processing means while a buffer amplifier with which the incoming signals can be amplified is preferably provided at the signal input. The evaluation means in the circuit preferably comprises a comparator with which signal compensation can be easily implemented.

In a preferred embodiment of the invention, the all-pass filter and the low-pass filter are symmetrically constructed since the needed phase reversal already automatically occurs and no other offset voltages are generated by additional invertors. In a most basic fashion, the all-pass filter and the low-pass filter can be formed of capacitors and resistors. In this way, the all-pass filter includes resistors which are connected parallel to one another and two capacitors which are cross-connected to the resistors.

In an embodiment of the present invention, the all-pass filter and the low-pass filter, in particular, or even the entire circuit is arranged integrated on a chip since no additional terminals or external components are required. Preferably, a balancing means is also provided. Great tolerances of integrated components often require such balancing means which can be implemented either during chip manufacture or when balancing the overall system.

Additional features and advantages of the present invention are described in, and will be apparent from, the detailed description of the presently preferred embodiments and from the drawings.

DETAILED DESCRIPTION OF THE PREFERRED EMBODIMENTS

Figure 1:
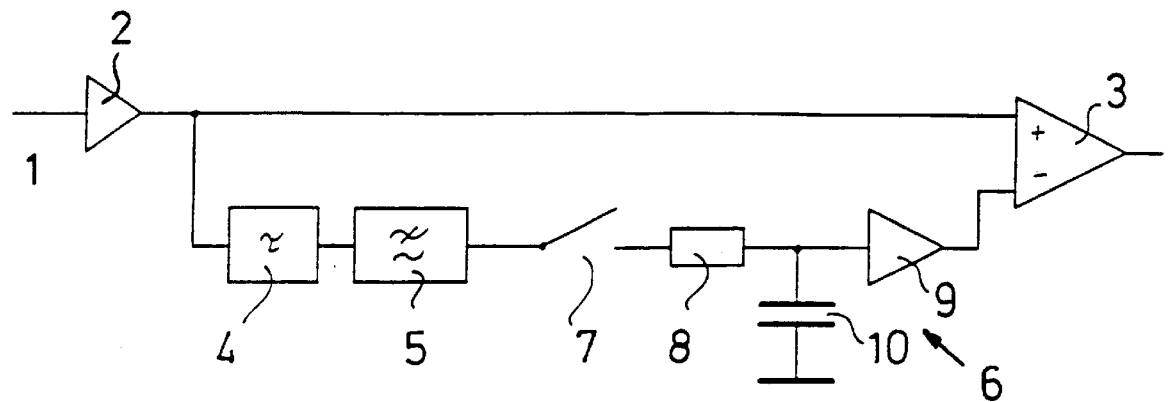
FIG. 1 shows a schematic diagram of an embodiment of the circuit of the present invention.

FIG. 1 shows a schematic diagram of the circuit of the present invention. A buffer amplifier 2 that is directly connected to the positive input of a comparator 3 is arranged at a signal input 1. Following the buffer amplifier 3, a parallel electrical connection branches off to the negative input of the comparator 3. The signal processing means is arranged in this connection and includes an all-pass filter 4, a low-pass filter 5 and a track and hold circuit 6, all of which are connected in series. The track and hold circuit 6 includes a switch element 7, a resistor 8 connected in series with the switch element 7 and an amplifier 9. A capacitor 10 connected to ground lies between the resistor 8 and the amplifier 9.

Figure 2:
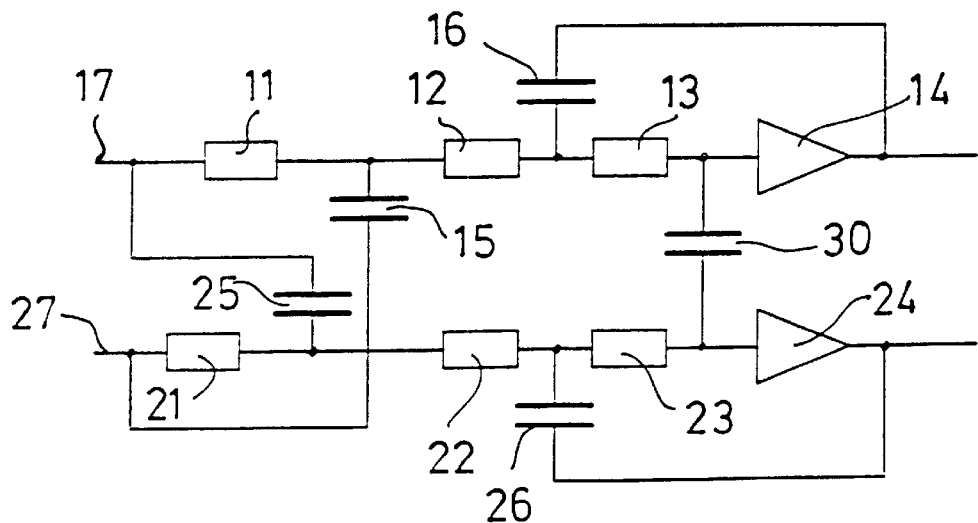
FIG. 2 shows a schematic diagram of an all pass/low-pass circuit in accordance with the principles of the present invention.

FIG. 2 shows a schematic diagram of an embodiment of the all-pass/low-pass circuit of the present invention. The all-pass/low-pass circuit is a symmetrical circuit arranged about two parallel electrical connections 17 and 27. Resistors 11, 12 and 13 and an amplifier 14 are arranged in series in the electrical connection 17. A feedback line via a capacitor 16, which is connected to the electrical connection 17 between the resistors 12 and 13, follows the amplifier 14. The electrical connection 27 is analogously constructed with resistors 21, 22 and 23, an amplifier 24 and a capacitor 26. An electrical connection via a capacitor 15 is provided between the resistors 11 and 12 to the electrical connection 27 at a point preceding the resistor 21. The capacitor 25 is provided in a symmetrical manner wherein a connection is provided between the resistors 25 and 22 to the electrical connection 17 at a point preceding the resistor 11. A capacitor 30 for the connection of the electrical connections 17 and 27 is also provided preceding the amplifiers 14 and 24. The resistors 11, 12, 21 and 22 and the capacitors 15 and 25 form the all-pass filter, whereas the other elements shown in FIG. 2 form the low-pass filter.

Figure 3:
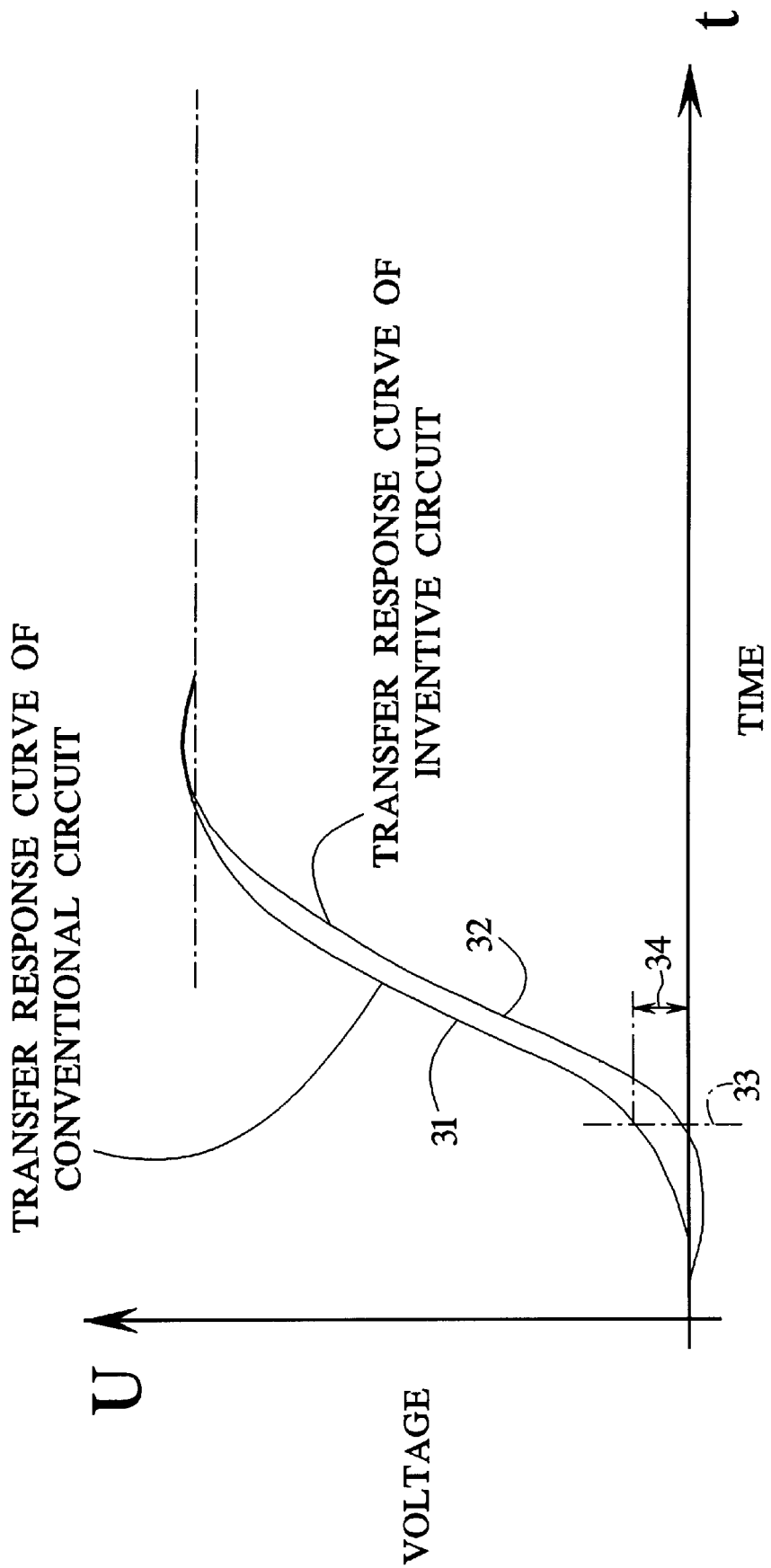
FIG. 3 shows a graphical diagram of a transfer response of a circuit of the present invention compared to that of a conventional circuit in this field.

FIG. 3 graphically shows the transfer response of the circuit of the present invention compared to that of a conventional circuit in this field. Time is entered on the X-axis and voltage is entered on the Y-axis. A principle-conditioned delay is needed for averaging. For example, this can amount to 2 bits and is assumed at the point referenced 33 on the X-axis in FIG. 3. Since the transfer response of a conventional circuit, whose curve is referenced at 31, has a monotonous character, a principle-conditioned error arises since, following the necessary delay, the curve 31 differs from 0. The size of this error is indicated at 34.

In contrast to the conventional circuit, the employment of an all-pass filter in the inventive circuit allows an entirely different transfer response to be achieved, as being referenced at 32 in FIG. 3. The transfer response of the circuit of the present invention assumes negative voltage values in the initial phase and then proceeds through a zero-axis crossing after a short period of time. The system is then tuned so that switching is carried out just when the transfer function passes through the zero point, and when the dc voltage part identified at this point in time is stored in the track and hold circuit and subtracted from the actual signal.

Although the present invention has been described with reference to a specific embodiment, those of skill in the art will recognize that changes may be made thereto without departing from the spirit and scope of the invention as set forth in the hereafter appended claims.

I claim as my invention:

1. A circuit for evaluating an input signal that is overlaid with a dc voltage part and, thereafter, for determining a data signal, the circuit comprising:

a signal input;

a signal processing means which includes a first filter and an all-pass filter which are matched to one another so that a transfer response is zero at a specific point in time; and an evaluation means which compares an original signal from the signal input to a portion of the signal input received from the signal processing means, and which determines the data signal.

2. A circuit as claimed in claim 1, further comprising:

a low-pass filter as the first filter in the signal processing means.

3. A circuit as claimed in claim 2, wherein the all-pass filter and the low-pass filter are symmetrically constructed.

4. A circuit as claimed in claim 2, wherein the all-pass filter and the low-pass filter are comprised of capacitors and resistors.

5. A circuit filter as claimed in claim 2, wherein the all-pass filter comprises serially-connected first and second resistors which are connected in parallel to serially-connected third and fourth resistors, and wherein the all-pass filter further comprises a first capacitor connected between an input to the first resistor and the connection between the third and fourth resistors, and wherein the all-pass filter further comprises a second capacitor connected between an input to the third resistor and the connection between the first and second resistors.

6. A circuit as claimed in claim 2 further comprising:

a track and hold circuit in the signal processing means.

7. A circuit as claimed in claim 6, wherein the low-pass filter and the track and hold circuit are designed as minimal phase systems.

8. A circuit as claimed in claim 2, further comprising:

an integrated chip in which the all-pass filter and the low-pass filter are formed.

9. A circuit as claimed in claim 1, further comprising:

a buffer amplifier at the signal input.

10. A circuit as claimed in claim 1, further comprising:

a comparator in the evaluation means.

\* \* \* \* \*